United States Patent
Raynor

(10) Patent No.: US 10,263,021 B2
(45) Date of Patent: Apr. 16, 2019

(54) GLOBAL SHUTTER PIXELS HAVING SHARED ISOLATED STORAGE CAPACITORS WITHIN AN ISOLATION STRUCTURE SURROUNDING THE PERIMETER OF A PIXEL ARRAY

(71) Applicant: STMicroelectronics (Research & Development) Limited, Marlow, Buckinghamshire (GB)

(72) Inventor: Jeffrey M. Raynor, Edinburgh (GB)

(73) Assignee: STMicroelectronics (Research & Development) Limited, Marlow (GB)

(*) Notice: Subject to any disclaimer, the term of this patent is extended or adjusted under 35 U.S.C. 154(b) by 205 days.

(21) Appl. No.: 15/376,357

(22) Filed: Dec. 12, 2016

(65) Prior Publication Data

US 2018/0166477 A1 Jun. 14, 2018

(51) Int. Cl.
*H01L 27/146* (2006.01)
*H04N 5/3745* (2011.01)

(52) U.S. Cl.
CPC .... *H01L 27/14603* (2013.01); *H01L 27/1463* (2013.01); *H01L 27/14621* (2013.01); *H01L 27/14645* (2013.01); *H04N 5/37452* (2013.01)

(58) Field of Classification Search
CPC ......... H01L 27/14609; H01L 27/14643; H01L 27/14601; H01L 27/3244; H04N 5/37452
See application file for complete search history.

(56) References Cited

U.S. PATENT DOCUMENTS

| | | | |
|---|---|---|---|
| 2007/0285544 A1* | 12/2007 | Yamada | H04N 5/335 348/294 |
| 2010/0276572 A1 | 11/2010 | Iwabuchi et al. | |
| 2014/0008520 A1* | 1/2014 | Raynor | H01L 27/14612 250/208.1 |
| 2014/0077063 A1 | 3/2014 | Cho | |
| 2017/0272677 A1 | 9/2017 | Shishido et al. | |
| 2017/0301717 A1 | 10/2017 | Kudoh | |
| 2017/0359542 A1 | 12/2017 | Bairo | |
| 2018/0020172 A1 | 1/2018 | Hirota | |

* cited by examiner

*Primary Examiner* — Ermias T Woldegeorgis
(74) *Attorney, Agent, or Firm* — Crowe & Dunlevy

(57) ABSTRACT

Disclosed herein is an electronic device including an integrated circuit substrate, with a pixel array area within the integrated circuit substrate. A first deep trench isolation structure is formed in the integrated circuit substrate about a perimeter of the pixel array area. First, second, third, and fourth pixels are within the pixel array area and spaced apart from one another. A storage capacitor area is within the integrated circuit substrate and interior to the first deep trench isolation structure. A second deep trench isolation structure is formed in the integrated circuit substrate about a perimeter of the storage capacitor area. The second deep trench isolation structure may serve to electrically isolate the storage capacitor area from the first, second, third, and fourth pixels.

22 Claims, 6 Drawing Sheets

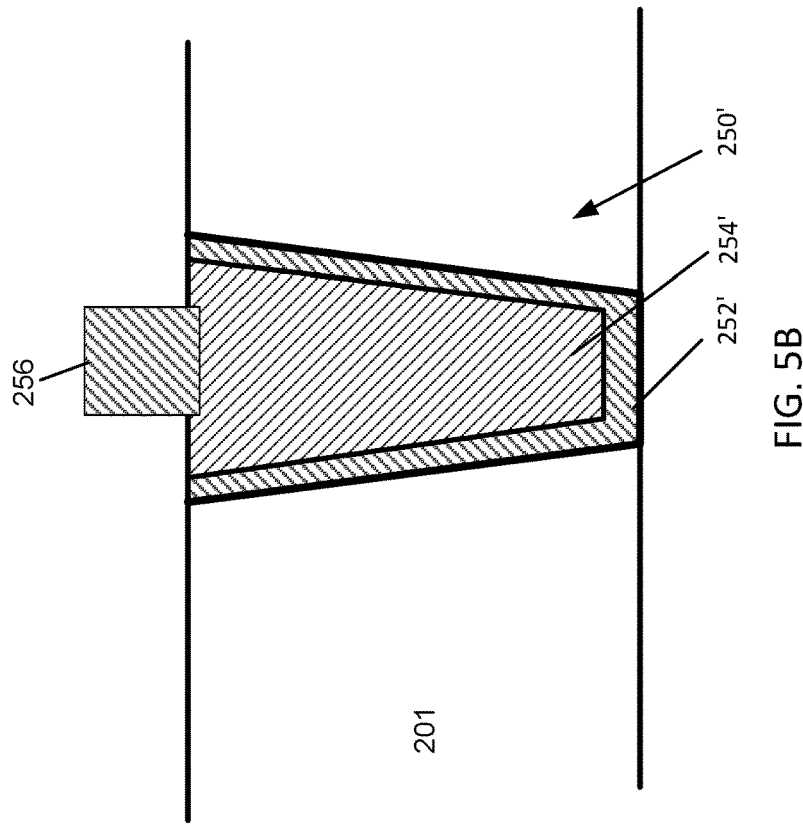
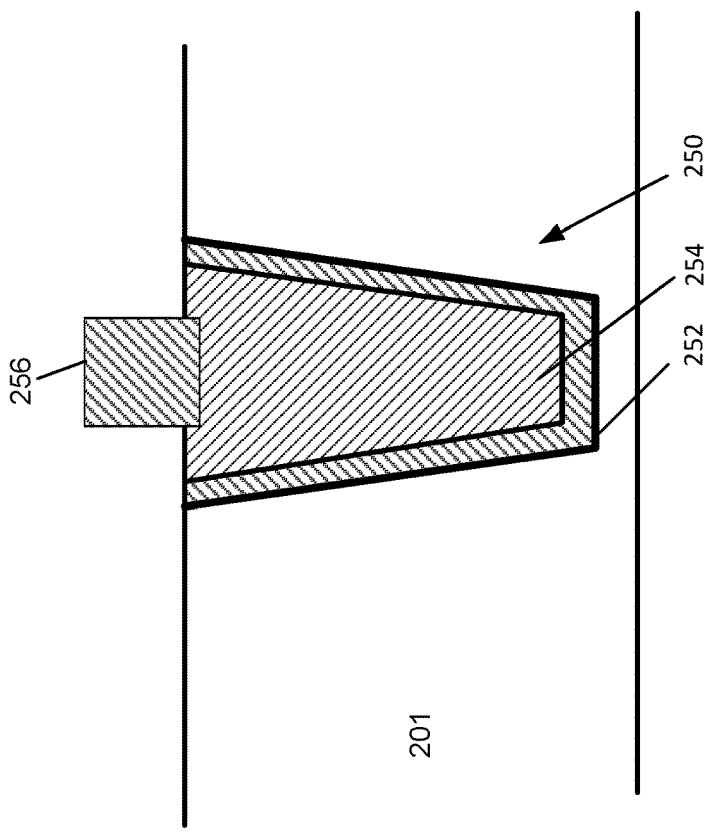

GLOBAL SHUTTER PIXELS HAVING SHARED ISOLATED STORAGE CAPACITORS WITHIN AN ISOLATION STRUCTURE SURROUNDING THE PERIMETER OF A PIXEL ARRAY

TECHNICAL FIELD

Disclosures herein relate to image sensors and layouts therefor that reduce area for a given pixel size.

BACKGROUND

Digital photography has overtaken traditional film based photography as the routine means by which images are taken and stored. Initially confined to single purpose camera devices, over time digital cameras incorporated into cellular phones grew increasingly popular, and at the present time, the majority of digital images captured by individuals for non-commercial purposes are captured using a digital camera incorporated within a cellular phone. Accordingly, as the desire for cellular phones capable of acting as digital cameras grew, the desire for the digital images captured by those cellular phones to be of higher quality grew.

For years, the image sensors used within the digital camera systems of cellular phones increased in resolution (i.e. pixel count), with top of the line cellular phones incorporating image sensors having more than 16 million pixels (MP), and in one case, over 40 MP.

This increase in resolution was accomplished in part by shrinking the size of individual pixels. This in turn results in each pixel having a reduced charge storage capacity, which means that each pixel captures less light. Since the maximum signal to nose ratio is a function of the square root of the charge storage capacity, these smaller pixels ultimately result in a worse signal to noise ratio.

Consequently, the trend to greater numbers of smaller pixels began to reverse, and the current trend is toward smaller numbers of larger pixels. Since image sensors for cellular phones are desired to be small and compact, the challenge is therefore to design sensors with larger pixels, yet keep the sensor size as compact as possible.

Due to this challenge, rolling blade operated type pixels are commonly employed instead of global shutter operated pixels, due to the traditionally smaller area occupied by rolling blade shutter pixels. However, as will be explained, rolling blade shutter pixels have drawbacks compared to global shutter pixels.

In a rolling blade shutter, an array of pixels are processed line by line, with one being integrated and another being read out for each movement of the shutter. The shutter moves over the array so that the pixels are exposed for the same amount of time, but not at the same time. A rolling blade shutter may not work well when taking images of fast moving objects, such as fans, helicopter blades, or propellers.

With a global shutter, the pixels of the array are simultaneously released from reset and start to integrate simultaneously. Resultantly, the drawbacks of a rolling blade shutter are not present. After a specific period, the pixels are then read out simultaneously into a temporary storage, which may be located inside the pixel. This temporary storage is then scanned out row by row where the signal is amplified or converted into a digital value.

Since the pixels integrate simultaneously, each pixel has at least one dedicated storage capacitor. The various challenges involved in the design of these storage capacitors result in the consumption of an undesirable amount of surface area. So as to make global shutters more size competitive with rolling blade shutters, new designs are desired.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is an electronic device that includes an integrated circuit substrate, with a pixel array area within the integrated circuit substrate. A boundary isolation region is formed in the integrated circuit substrate about a perimeter of the pixel array area. A first pixel is within the pixel array area, and a second pixel spaced apart from the first pixel is also within the pixel array area. A storage capacitor area is between the first pixel and the second pixel and common to the first pixel and second pixel.

A first capacitor area isolation region is formed in the integrated circuit substrate between the storage capacitor area and the first pixel and extends between first and second portions of the boundary isolation region. A second capacitor area isolation region is formed in the integrated circuit substrate between the storage capacitor area and the second pixel and extends between the first and second portions of the boundary isolation region.

At least one storage capacitor is within the storage capacitor area and electrically coupled to the first pixel. At least one storage capacitor within the storage capacitor area and electrically coupled to the second pixel.

Also disclosed herein is an electronic device including an integrated circuit substrate, with a pixel array area within the integrated circuit substrate. A first deep trench isolation structure is formed in the integrated circuit substrate about a perimeter of the pixel array area. First, second, third, and fourth pixels are within the pixel array area and spaced apart from one another. A storage capacitor area is within the integrated circuit substrate and interior to the first deep trench isolation structure. A second deep trench isolation structure is formed in the integrated circuit substrate about a perimeter of the storage capacitor area. The second deep trench isolation structure may serve to electrically isolate the storage capacitor area from the first, second, third, and fourth pixels.

BRIEF DESCRIPTION OF THE DRAWINGS

FIG. 5A is a cross sectional diagram of an image sensor cell illustrating potential structure of the deep isolation trenches of FIGS. 3-4.

FIG. 5B is a cross sectional diagram of an image sensor cell illustrating potential structure of the deep isolation trenches of FIGS. 3-4.

DETAILED DESCRIPTION

One or more embodiments of the present disclosure will be described below. These described embodiments are only examples of the presently disclosed techniques. Additionally, in an effort to provide a concise description, all features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

This disclosure is directed to a layout and structure for cells of an image sensor utilizing a global shutter, in which multiple pixels share a single capacitor bank. That layout will be described in detail below, but first a potential pixel architecture to use in this layout will be described. It should be noted, however, that any pixel suitable for use with a global shutter may be used in this layout.

Figure 1A:
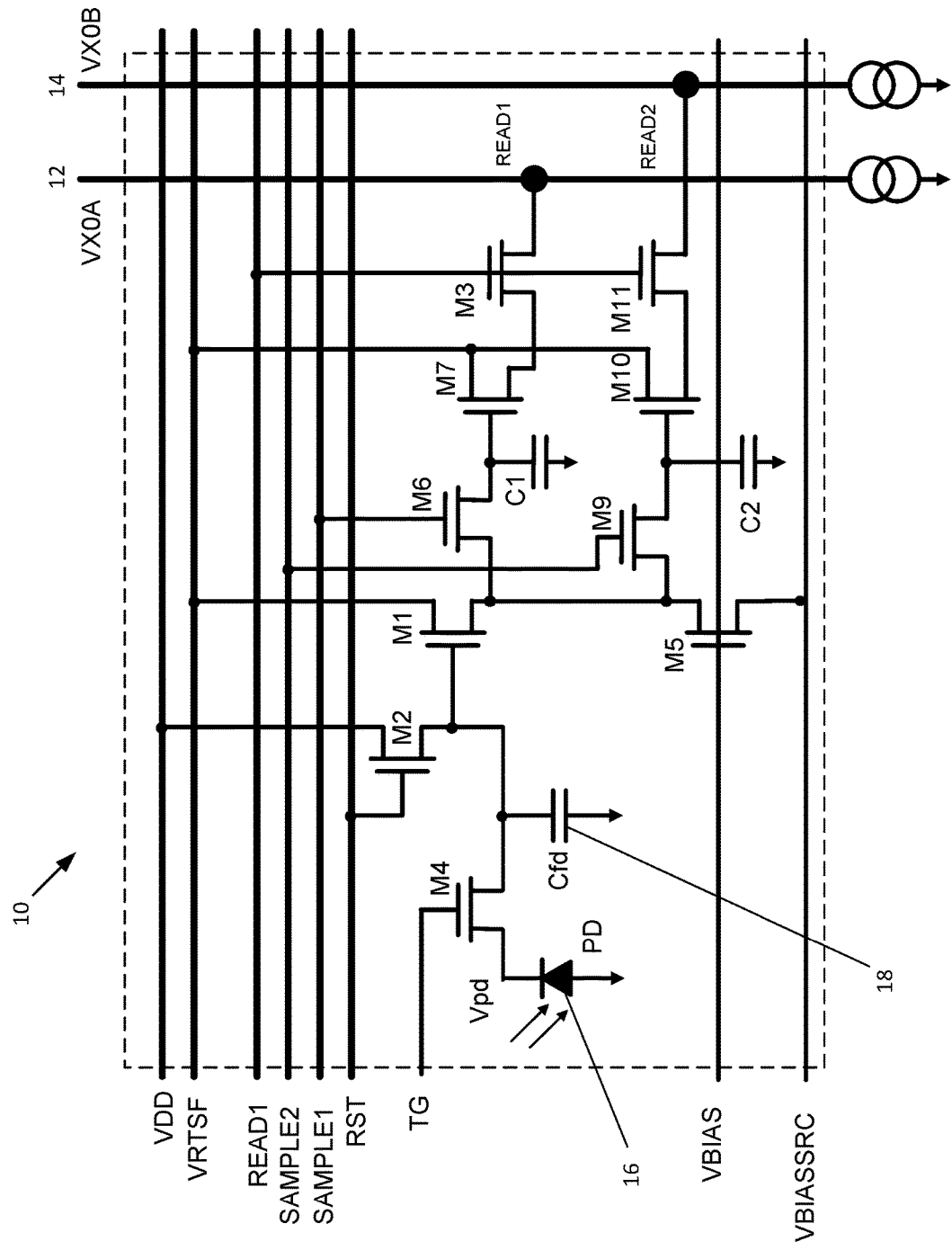
FIG. 1A is a circuit diagram of a ten transistor pixel architecture circuit, in accordance with this disclosure.

Referring to FIG. 1A, the pixel architecture 10 will now be described. This is a ten transistor pixel with two output bit lines. The circuit 10 includes a number of transistors M1 to M11, the functions of which will be set out in more detail below. It should be noted that the capacitors C1 and C2 may be replaced with transistors configured to act as capacitors. The circuit also includes two output bit lines 12 and 14, a photodiode 16, and a floating diffusion capacitor 18. The circuit includes input and output lines (VDD, VRT, TG, VBIAS, READ1, SAMPLE1, SAMPLE2 and RESET).

M1 is a source-follower where the voltage on the source of M1 follows the voltage on the gate of M1. M2 is used to reset the floating diffusion capacitor 18 and if TG is high, the photodiode 16 is also be reset if RST is simultaneously asserted. M3 is a read transistor and is enabled when the signal from the corresponding row is required. It is disabled when another row in the sensor is being accessed.

M4 is a transfer gate transistor to transfer charge during pixel reset from VRT to the photodiode and during pixel readout from the photodiode to the floating diffusion node. M5 is an active load for M1 to help ensure it operates correctly. To save power, it is possible to pull VBIAS low when the pixels are not being read out so that M1 is not used. Transistor M6 is used as a switch and when enabled, allowing the voltage at the source of M1 to be stored on the capacitor C1. C1 can be a metal-metal capacitor, but as the capacitor is storing a voltage and not a charge and is followed by a source-follower transistor (M7), it does not need to be linear and hence the gate of a MOS transistor can be used as the capacitor. M7 is a source follower for the voltage on the storage node C1.

M9 provides the same functionality as M6, but for a second storage site. M10 provides the same functionality as M7, but for the second storage site. M11 provides the same functionality as M3, but for the second storage site. C2 provides the same functionality as C1, but for the second storage site.

In the prior art there are architectures which include two capacitors or storage devices. The control of storage to, or read out from, the capacitors does not enable two separate images to be handled separately. In addition, there is an effect from the first storage device on the second storage device (and vice versa) when storing and reading due to charge sharing and the like.

The circuit 10 overcomes these issues by writing to and reading from each storage element independently. The two storage elements C1 and C2 are each written to respectively at first and second times, which times correspond to the successive frames captured.

Figure 1B:
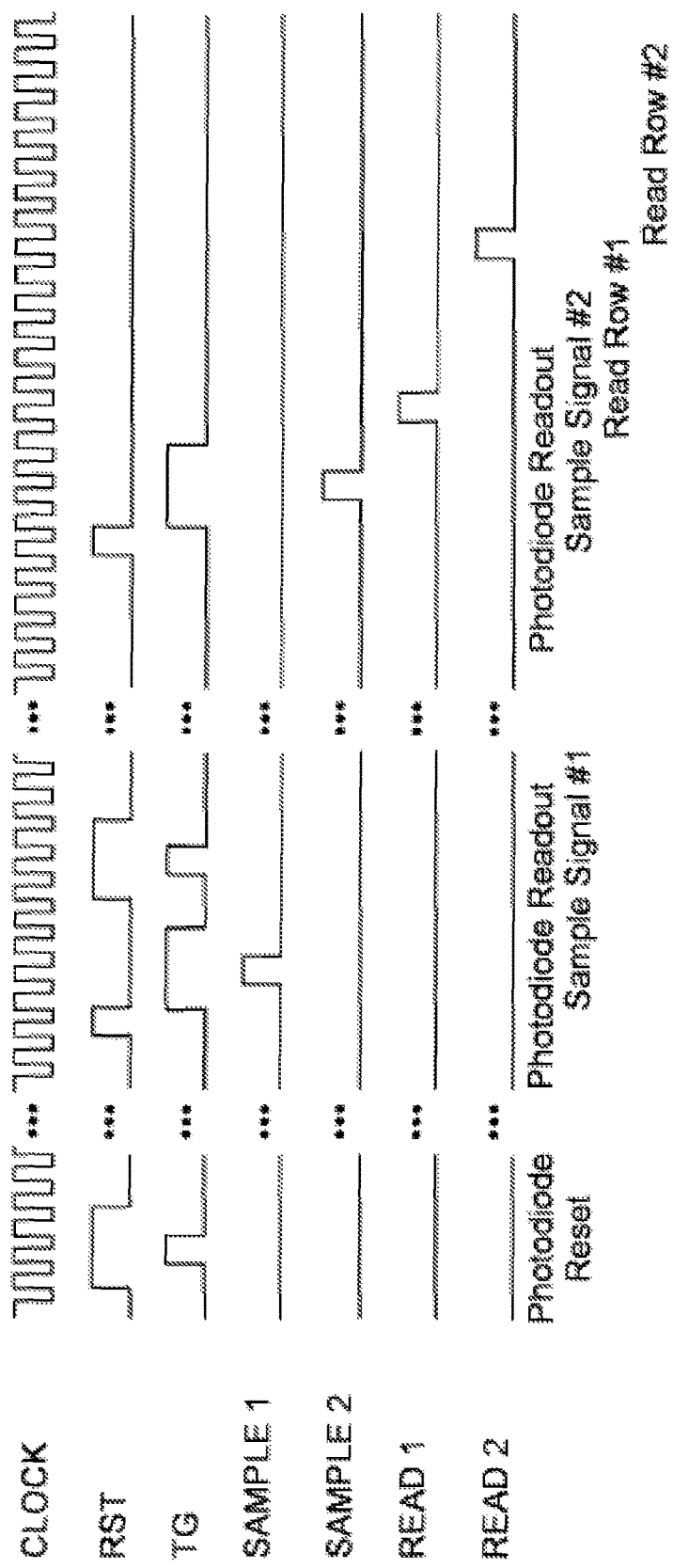
FIG. 1B is a timing diagram of the circuit shown in FIG. 1A.

Operation of the circuit 10 can be seen in FIG. 1B. This sequence captures two images and then reads the images out. The two images may be one with ambient and LED illumination and one with ambient illumination, or may be two subsequent images.

The first operation is to reset the photodiode. This is done by pulsing TG (transfer gate) high while the RESET is high. The system then waits an appropriate period of time (variously called exposure time, integration time or shutter time) and then the signal on the photodiode is sampled and voltage corresponding to the intensity of the signal is stored. This is accomplished by first resetting the floating diffusion node 18 in FIG. 1 by pulsing RESET with TG low. The photo-generated charge from the photodiode is transferred to the floating diffusion node 18 by pulsing TG and this charge is converted to a voltage by the capacitance of the floating diffusion capacitor 18. The voltage is buffered by the source follower M1. The signal is stored on the first sampling capacitor (C1) by enabling the switch transistor M6 by pulsing SAMPLE1 high.

At this point in time, the signal from the first frame has been stored and the photodiode is reset again. The system then waits an appropriate period of time and the second frame and the photo-generated charge is then read out in a similar manner, except that this time the signal is stored on the second sampling capacitor (C2) by enabling the switch transistor M9 with a high logic level pulse SAMPLE2.

Two images have now been independently acquired and stored in all the pixels in the array. Each of the two images may then be read out independently and optionally converted to a digital signal. Typically this is done row by row by pulsing high the READ signal of each row of the array sequentially.

Figure 2:
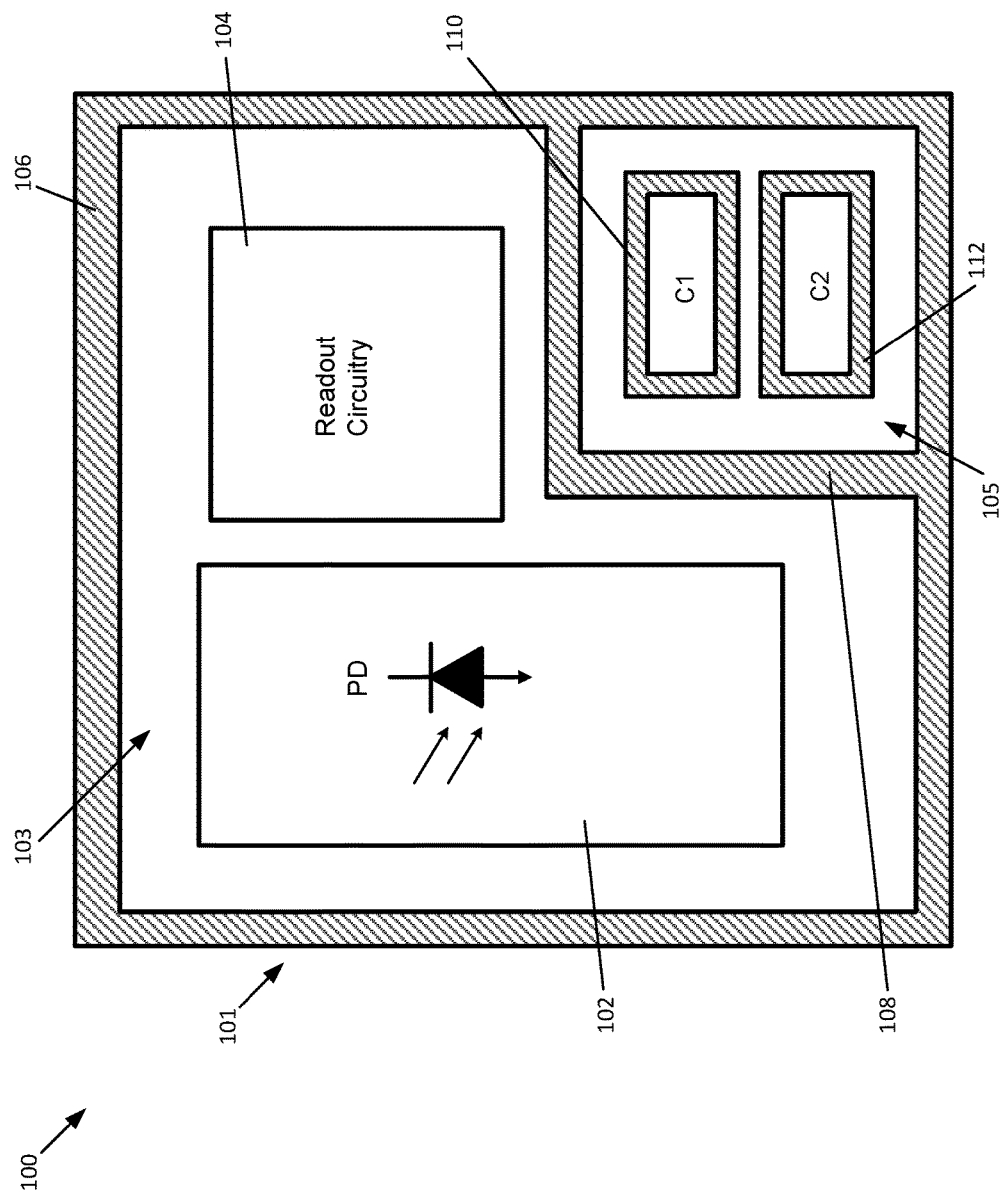
FIG. 2 is a schematic block diagram of an image sensor cell, in accordance with this disclosure.

With reference to FIG. 2, an image cell 100 including the pixel 104 described above is now described. The image cell 100 is formed on, and/or integrated within, an integrated circuit substrate 101. The image cell 100 is a cell of an image sensor, such as may be utilized within a smartphone. The image cell 100 as shown defines and inhabits a pixel array area within the integrated circuit substrate 101. A boundary isolation region 106 is formed in the integrated circuit substrate about a perimeter of the image cell 100, and serves to electrically isolate the image cell 100 from other portions of the image sensor itself. A pixel area 103 comprising a photodiode 102 and readout circuit 104 is located inside the area enclosed by the boundary isolation region 106. A set of storage capacitors C1 and C2 for storing data from the photodiode 102 and readout circuit 104 are also located inside a storage capacitor area 105 enclosed by the boundary isolation region 106.

A capacitor area isolation region 108 is formed in the integrated circuit substrate in a shape suited to electrically separate the storage capacitor area 105 from the pixel area 103, and thus from the photodiode 102 and readout circuit 104.

The capacitors C1 and C2 themselves formed from capacitive deep trench isolation regions 110 and 112. As shown, the isolation regions 110 and 112 of the capacitors C1 and C2 are spaced apart from one another, are spaced apart from the capacitor area isolation region 108, and are also spaced apart from the isolation region 106.

Since, as shown, the storage capacitor area 105 containing the capacitors C1 and C2 serves but the single pixel 103 formed by the photodiode 102 and readout circuit 104, a considerable percentage of the available surface area of the pixel array area on the integrated circuit substrate 101 is consumed by the storage capacitor area. This may be undesirable in some instances, and may render the image cell 100 larger than designs which use a rolling blade shutter.

Figure 3:
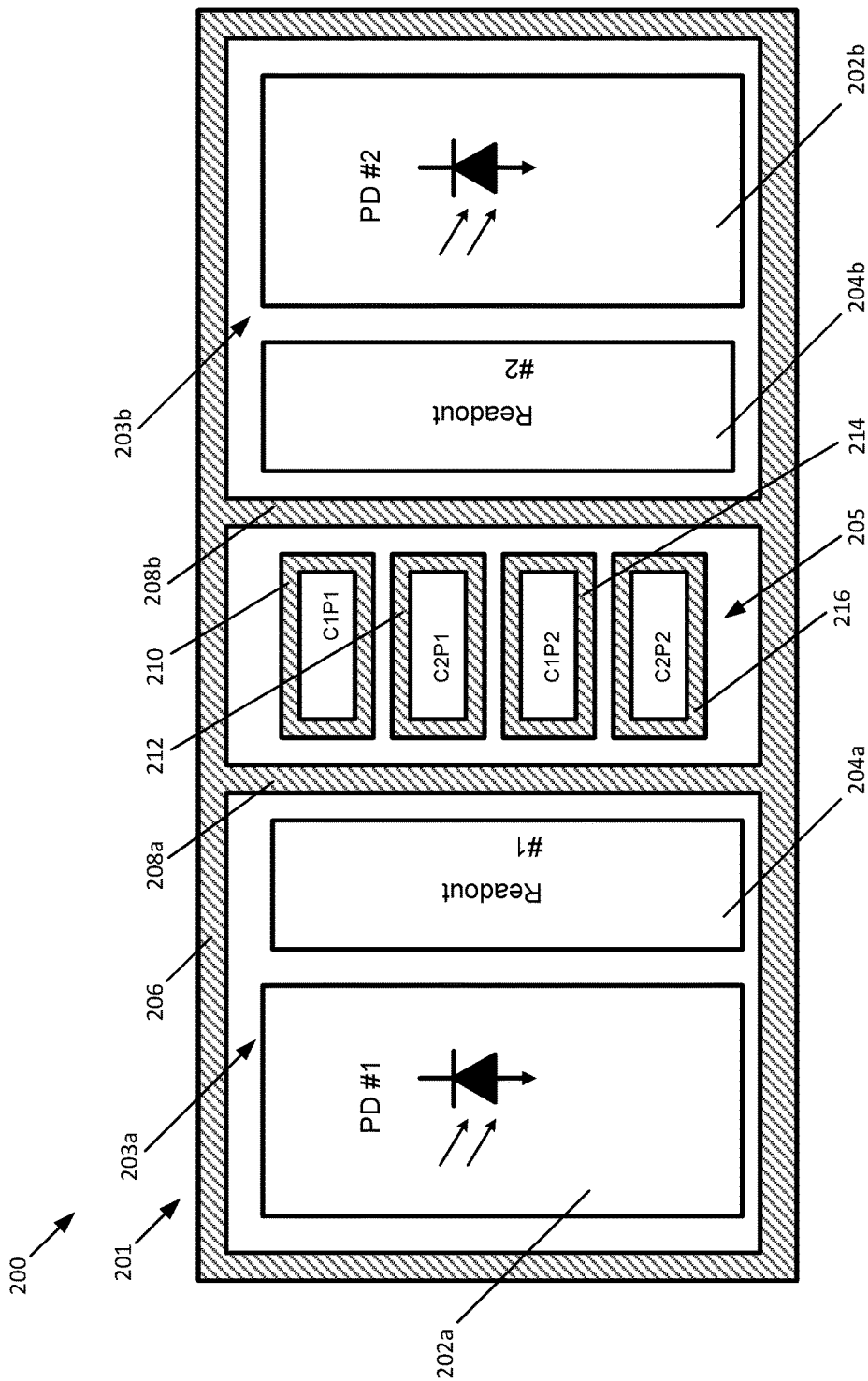
FIG. 3 is a schematic block diagram of an image sensor cell in which two pixels share isolated capacitors, in accordance with this disclosure.

Therefore, a further design of the image sensor 201 in which the surface area consumed by the storage capacitor area 205 is reduced is now described with reference to FIG. 3. In this design, the image sensor 201 includes two pixels 203a and 203b, and the perimeter of the pixel array area is also enclosed by the boundary isolation region 206 formed within the integrated circuit substrate 201. The pixel 203a includes a photodiode 202a and readout circuitry 204a for the photodiode 202a, and the pixel 203b includes a photodiode 202b and readout circuitry 204b for the photodiode 202b.

A first capacitor area isolation region 208a within the integrated circuit substrate 201 extends from one side of the boundary isolation region 206 to the other side. A second capacitor area isolation region 208b within the integrated circuit substrate 201 extends from one side of the boundary isolation region 206 to the other side. Thus, the first and second capacitor area isolation regions 208a and 208b serve to enclose the storage capacitor area 205, and serve to electrically isolate the storage capacitor area 205 from the pixel areas 203a and 203b.

Within the storage capacitor area 205 are first and second capacitors C1P1 and C2P1 for storing output from the first pixel 203a, and third and fourth capacitors C1P2 and C2P2 for storing output from the second pixel 203b. It should be noticed that the storage capacitor area 205 serves both the first and second pixels 203a and 203b, is common to both the first and second pixels 203a and 203b, and itself is not subdivided. Thus, the storage capacitor area 205 is a single region of the integrated circuit substrate 201 dedicated to both the first and second pixels 203a and 203b.

The capacitors C1P1, C2P1, C1P2, and C2P2 themselves are each formed from capacitive deep trench isolation regions 210, 212, 214, and 216. As shown, the capacitive deep trench isolation regions 210, 212, 214, and 216 of the capacitors C1P1, C2P1, C1P2, and C2P2 are spaced apart from one another, are spaced apart from the capacitor area isolation regions 208a and 208b, and are also spaced apart from the isolation region 206.

By using the structures 200 shown for a cell including two pixels 203a and 203b, as opposed to simply repeating the structure 100 (of FIG. 2) twice, space savings are provided. Referring to FIG. 2, since the storage capacitors C1 and C2 are to be spaced apart from the isolation regions 206 and 208, if the structure 100 were repeated, excess surface area would be consumed by the spacing between the capacitors and the isolation regions 206 and 208. Since the design shown in FIG. 3 groups the capacitors C1P1, C2P1, C1P2, and C2P2 for both pixels 203a and 203b in one region, this space is saved.

Since the storage capacitor region 205 is located between the pixels 203a and 203b, it should be apparent that the physical layout of the pixels 203a and 203b themselves are mirror images of one another. Thus, as shown, the readout circuitry 204a and 204b of the pixels 203a and 203b face the storage capacitor region 205, and are closer to the isolation regions 208a and 208b than to the ends of the isolation region 206. Similarly, the photodiodes 202a and 202b of the pixels 203a and 203b face the ends of the isolation region 206, and are farther from the storage capacitor region 205 than from the isolation region 206.

Figure 4:
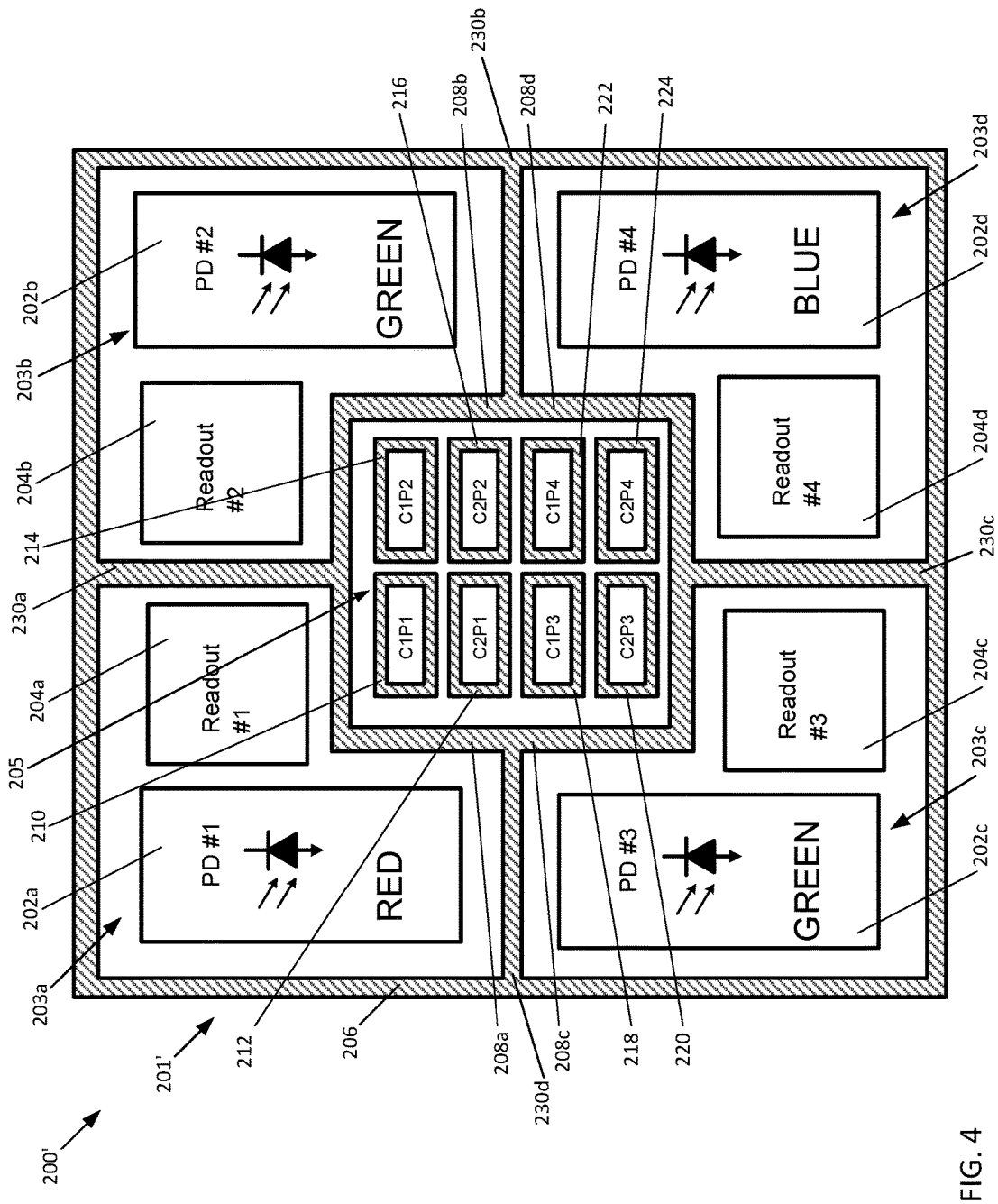
FIG. 4 is a schematic block diagram of an image sensor cell in which four pixels share isolated capacitors, in accordance with this disclosure.

Yet still further space can be saved (for example, halving the surface area consumed by the storage capacitor region 205), however, by the structure 200' shown in FIG. 4. In this design, the image sensor 201' includes four pixels 203a, 203b, 203c, 203d and the perimeter of the pixel array area is also enclosed by the boundary isolation region 206 formed within the integrated circuit substrate 201. The pixel 203a includes a photodiode 202a and readout circuitry 204a for the photodiode 202a, and the pixel 203b includes a photodiode 202b and readout circuitry 204b for the photodiode 202b. The pixel 203c includes a photodiode 202c and readout circuitry 204c for the photodiode 202c, and the pixel 203d includes a photodiode 202d and readout circuitry 204d for the photodiode 202d.

A singular capacitor area isolation region is formed in the integrated circuit substrate 201 from isolation region segments 208a-208d in the integrated circuit substrate 200, and serves to surround the isolation capacitor region 205. Isolation region segments 230a-230d serve to connect the singular isolation region formed from 208a-208d to the boundary isolation region 206. These structures therefore serve to enclose the storage capacitor area 205, and serve to electrically isolate the storage capacitor area 205 from the pixel areas 203a, 203b, 203c, and 203d.

Within the storage capacitor area 205 are first and second capacitors C1P1 and C2P1 for storing output from the first pixel 203a, third and fourth capacitors C1P2 and C2P2 for storing output from the second pixel 203b, fifth and sixth capacitors C1P3 and C2P3 for storing output from the third pixel 203c, and seventh and eighth capacitors C1P4 and C2P4 for storing output from the fourth pixel 204d.

It should be noticed that the storage capacitor area 205 serves each of the first, second, third, and fourth pixels 203a-203d, is common to both the first, second, third, and fourth pixels 203a-203d, and itself is not subdivided. Thus, the storage capacitor area 205 is a single region of the integrated circuit substrate 201 dedicated to both each of the pixels 203a-203d.

The capacitors C1P1, C2P1, C1P2, C2P2, C1P3, C2P3, C1P4, and C2P4 themselves are each formed from capacitive deep trench isolation regions 210, 212, 214, 216, 218, 220, 222, 224. As shown, the capacitive deep trench isolation regions 210, 212, 214, 216, 218, 220, 222, 224 of the capacitors C1P1, C2P1, C1P2, C2P2, C1P3, C2P3, C1P4, and C2P4 are spaced apart from one another, are spaced apart from the capacitor area isolation regions 208a and 208b, and are also spaced apart from the isolation region 206

Since the storage capacitor region 205 is located centrally between the pixels 203a-203d, it should be apparent that the physical layout of the pixels 203a and 203b themselves are mirror images of one another with respect to a vertical axis of the storage capacitor region 205, with the physical layout of the pixels 203c and 203d being mirror images of pixels 203a and 203b with respect to a horizontal axis of the storage capacitor region 205.

This mirroring of the components of the pixels 203a-203d results in slight differences in the photodiodes 202a-202d which result the photodiodes collecting different wavelengths of light (colors) differently depending on their orientation. So as to address this while maintaining a high quality of captured image, color filters are placed over the photodiodes 202a-202d that are dependent on the position of the photodiodes 202a-202d. Where four pixels 203a-203d are used, placing the color filters in a Bayer pattern over the photodiodes 202a-202d results in high quality images.

As shown, the readout circuitry 204a and 204b of the pixels 203a and 203b face the storage capacitor region 205, and are closer to the isolation regions 208a and 208b than to the ends of the isolation region 206. In addition, the readout circuitry 204c and 204d of the pixels 203c and 203d face the storage capacitor region 205, and are closer to the isolation regions 208c and 208d than to the ends of the isolation region 206.

Similarly, the photodiodes 202a and 202b of the pixels 203a and 203b face the ends of the isolation region 206, and are farther from the storage capacitor region 205 than from the isolation region 206. Likewise, the photodiodes 202c and 202d of the pixels 203c and 203d face the ends of the isolation region 206, and are farther from the storage capacitor region 205 than from the isolation region 206.

The various isolation regions 106, 108, 206, 208a-208d, 230a-230d, 210, 212, 214, 216, 218, 220, 222, 224 may be formed as deep isolation trenches, either full or partial, and may form unitary structures with one another where the drawing figures show them as connected. Thus, for example, with respect to FIG. 4, the isolation regions 206, 230a-230d, and 208a-208d, may ultimately after formation be a unitary, unbroken, monlithic structure.

These isolation regions 106, 108, 206, 208a-208d, 230a-230d, 210, 212, 214, 216, 218, 220, 222, 224 may be capacitive deep isolation trenches 250, 250' having the structure shown in FIG. 5A-5B. For example, the deep isolation trenches 250, 250' may include a dielectric layers 252, 252', with conductive layers 254, 254' on the dielectric layers 252, 252'.

A voltage may be applied to the conductive layers 254, 254' of the deep isolation trenches 250, 250' via terminals 256 to create an electric field to aid with isolation. Alternatively, the conductive layers 254, 254' can act as one plate of a capacitor, while the integrated circuit substrate 201 can act as the other plate of the capacitor, aiding with isolation as well. The dielectric layers 252, 252' are formed from a high-K dielectric and are thin.

The deep isolation trench 250' may reach through the entire, or substantially the entire thickness of the integrated circuit substrate 201 in some cases, although in others, the deep isolation trench 250 may not extend through the entire, or substantially the entire thickness of the integrated circuit substrate 201, and may instead extend through approximately 60%-90% of the integrated circuit substrate 201.

It should be understood that different ones of the various isolation regions 106, 108, 206, 208a-208d, 230a-230d, 210, 212, 214, 216, 218, 220, 222, 224 may have any of the structures described above, with some being full deep trench isolation regions, and others being partial capacitive deep trench isolation regions.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:
1. An electronic device, comprising:
an integrated circuit substrate;
a pixel array area within the integrated circuit substrate;
a boundary isolation region formed in the integrated circuit substrate about a perimeter of the pixel array area;
a first pixel within the pixel array area;
a second pixel spaced apart from the first pixel within the pixel array area;
a storage capacitor area between the first pixel and the second pixel and common to the first pixel and second pixel;
a first capacitor area isolation region formed in the integrated circuit substrate between the storage capacitor area and the first pixel and extending between first and second portions of the boundary isolation region;
a second capacitor area isolation region formed in the integrated circuit substrate between the storage capacitor area and the second pixel and extending between the first and second portions of the boundary isolation region;
at least one storage capacitor within the storage capacitor area and electrically coupled to the first pixel; and
at least one storage capacitor within the storage capacitor area and electrically coupled to the second pixel.

2. The electronic device of claim 1, wherein the boundary isolation region comprises a deep trench isolation region; wherein the first capacitor area isolation region comprises a first partial depth capacitive deep trench isolation region; and wherein the second capacitor area isolation region comprises a second partial depth capacitive deep trench isolation region.

3. The electronic device of claim 2, wherein the first capacitor area isolation region forms the at least one storage capacitor within the storage capacitor area electrically coupled to the first pixel; and wherein the second capacitor area isolation region forms the at least one storage capacitor within the storage capacitor area and is electrically coupled to the second pixel.

4. The electronic device of claim 2, wherein the deep trench isolation region comprises a deep isolation trench extending completely through the integrated circuit substrate.

5. The electronic device of claim 2, wherein the first capacitor area isolation region comprises a trench defined in the integrated circuit substrate and extending partially therethrough, an insulation layer on sidewalls of the trench, and a conductor contained by the insulation layer.

6. The electronic device of claim 2, wherein the second capacitor area isolation region comprises a trench defined in the integrated circuit substrate and extending partially therethrough, an insulation layer on sidewalls of the trench, and a conductor contained by the insulation layer.

7. The electronic device of claim 1, wherein the at least one storage capacitor associated with the first pixel comprises a first capacitor associated with the first pixel; wherein the at least one storage capacitor associated with the second pixel comprises a second capacitor associated with the second pixel; further comprising a first isolation region formed in the integrated circuit substrate about a perimeter of the first capacitor, and a second isolation region formed in the integrated circuit substrate about a perimeter of the second capacitor.

8. The electronic device of claim 7, wherein the first isolation region is spaced apart from the second isolation region within the integrated circuit substrate.

9. The electronic device of claim 7, wherein at least one of the first isolation region and the second isolation region is spaced apart from the boundary isolation region.

10. The electronic device of claim 7, wherein at least one of the first isolation region and the second isolation region is spaced apart from the first capacitor area isolation region and the second capacitor area isolation region.

11. The electronic device of claim 1, further comprising a third pixel spaced apart from the first and second pixels within the pixel array area, and a fourth pixel spaced apart from the first, second, and third pixels within the pixel array area; wherein the first and second capacitor area isolation regions define a single capacitor isolation region formed in the integrated circuit substrate about a perimeter of the storage capacitor area and having first and second opposing sides and first and second opposing ends; wherein the boundary isolation region has first and second opposing sides and first and second opposing ends; further comprising a first intermediate isolation region extending from the first side of the boundary isolation region to the first side of the single capacitor isolation region, a second intermediate isolation region extending from the second side of the boundary isolation region to the second side of the single capacitor isolation region, a third intermediate isolation region extending from the first end of the boundary isolation region to the first end of the single capacitor isolation region, and a fourth intermediate isolation region extending from the second end of the boundary isolation region to the second end of the single capacitor isolation region; and further comprising at least one storage capacitor within the storage capacitor area associated with the third pixel, and at least one storage capacitor within the storage capacitor area associated with the fourth pixel.

12. The electronic device of claim 11, wherein the first, second, third, and fourth pixels are arranged in a Bayer pattern within the pixel array area.

13. The electronic device of claim 11, wherein no other pixels other than the first, second, third, and fourth pixels are within the pixel array area.

14. The electronic device of claim 1, wherein the first and second portions of the boundary isolation region are first and second sides of the boundary isolation region.

15. The electronic device of claim 1, wherein the first pixel comprises a first photodiode, and readout circuitry for the first photodiode; wherein the second pixel comprises a second photodiode, and readout circuitry for the second photodiode; wherein the boundary isolation region has first and second opposing sides and first and second opposing ends; wherein the first capacitor area isolation region is formed in the integrated circuit substrate in the storage capacitor area and extending between the first and second sides of the boundary isolation region; wherein the second capacitor area isolation region is formed in the integrated circuit substrate in the storage capacitor area and extending between the first and second sides of the boundary isolation region; wherein the first photodiode is adjacent to the first end of the boundary isolation region; wherein the readout circuitry for the first photodiode is opposite the storage capacitor area and closer to the first capacitor area isolation region than the first end of the boundary isolation region; wherein the second photodiode is adjacent to the second end of the boundary isolation region; and wherein the readout circuitry for the second photodiode is opposite the storage capacitor area and closer to the second capacitor area isolation region than the second end of the boundary isolation region.

16. The electronic device of claim 1, wherein the at least one storage capacitor associated with the first pixel comprises first and second storage capacitors associated with the first pixel; and wherein the at least one storage capacitor associated with the second pixel comprises first and second storage capacitors associated with the second pixel.

17. An electronic device, comprising:
an integrated circuit substrate;
a pixel array area within the integrated circuit substrate;
a first deep trench isolation structure formed in the integrated circuit substrate about a perimeter of the pixel array area;
first, second, third, and fourth pixels within the pixel array area and spaced apart from one another;
a storage capacitor area within the integrated circuit substrate and interior to the first deep trench isolation structure; and
a second deep trench isolation structure formed in the integrated circuit substrate about a perimeter of the storage capacitor area.

18. The electronic device of claim 17, wherein the second deep trench isolation structure serves to electrically isolate the storage capacitor area from the first, second, third, and fourth pixels.

19. The electronic device of claim 17, wherein the pixel array area is subdivided into first, second, third, and fourth pixel regions respectively containing the first, second, third, and fourth pixels; and further comprising:
a first intermediate deep trench isolation structure extending from the first deep trench isolation structure to the second deep trench isolation structure, along a border between perimeters of the first and second pixel regions;
a second intermediate deep trench isolation structure extending from the first deep trench isolation structure to the second deep trench isolation structure, along a border between perimeters of the second and third pixel regions;
a third intermediate deep trench isolation structure extending from the first deep trench isolation structure to the second deep trench isolation structure, along a border between perimeters of the third and fourth pixel regions; and
a fourth intermediate deep trench isolation structure extending from the first deep trench isolation structure to the second deep trench isolation structure, along a border between perimeters of the fourth and first pixel regions.

20. The electronic device of claim 17, wherein the first deep trench isolation structure comprises an outer insulating layer in contact with the integrated circuit substrate, and an inner conductive layer in contact with the outer insulating layer.

21. The electronic device of claim 17, wherein the second deep trench isolation structure encloses a smaller portion of a surface area of the pixel array area than the first deep trench isolation structure.

22. The electronic device of claim 17, wherein the first, second, third, and fourth pixels are arranged in a Bayer pattern.

* * * * *